United States Patent
Li et al.

(10) Patent No.: US 9,685,471 B2
(45) Date of Patent: Jun. 20, 2017

(54) MANUFACTURING METHOD OF THIN FILM TRANSISTOR SUBSTRATE

(71) Applicant: Shenzhen China Star Optoelectronics Technology Co., Ltd., Shenzhen, Guangdong (CN)

(72) Inventors: Wenhui Li, Guangdong (CN); Chihyuan Tseng, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 204 days.

(21) Appl. No.: 14/381,920

(22) PCT Filed: Jul. 2, 2014

(86) PCT No.: PCT/CN2014/081433
§ 371 (c)(1),
(2) Date: Aug. 28, 2014

(87) PCT Pub. No.: WO2015/192397
PCT Pub. Date: Dec. 23, 2015

(65) Prior Publication Data
US 2016/0240567 A1    Aug. 18, 2016

(30) Foreign Application Priority Data
Jun. 19, 2014    (CN) .......................... 2014 1 0277297

(51) Int. Cl.
*H01L 21/00*       (2006.01)
*H01L 27/12*       (2006.01)
(Continued)

(52) U.S. Cl.
CPC ........ *H01L 27/1288* (2013.01); *G02F 1/1368* (2013.01); *G09F 9/30* (2013.01);
(Continued)

(58) Field of Classification Search
CPC ..................... H01L 27/127; H01L 27/1288
See application file for complete search history.

(56) References Cited

U.S. PATENT DOCUMENTS

2004/0180480 A1*  9/2004  Dejima ............... H01L 27/1214
                                                            438/161
2011/0122348 A1*  5/2011  Sakai .................. G02F 1/13338
                                                            349/110

(Continued)

FOREIGN PATENT DOCUMENTS

CN       102652330 A       8/2012
CN       102856351 A       1/2013

*Primary Examiner* — Dale E Page
*Assistant Examiner* — Quovaunda V Jefferson
(74) *Attorney, Agent, or Firm* — Andrew C. Cheng

(57) ABSTRACT

The present invention provides a manufacture method of a thin film transistor substrate. In the same photolithographic process, the via deposing process is implemented to the gate isolation layer and the etching stopper layer is patterned. That is, the photolithographic process is not implemented but the oxide semiconducting pattern is formed directly after the gate isolation layer is formed. After the etching stopper layer is formed, the gate isolation layer and the etching stopper layer are patterned in the same photolithographic process. Comparing with the manufacture method of prior art, one photolithographic process can be eliminated. Meanwhile, the aperture ratio is raised by forming an open at the transparent conducting layer.

10 Claims, 7 Drawing Sheets

(51) Int. Cl.
    *G02F 1/1368*     (2006.01)
    *G09F 9/30*     (2006.01)
    *H01L 21/3065*     (2006.01)
    *H01L 21/308*     (2006.01)
    *H01L 29/66*     (2006.01)
    *H01L 21/311*     (2006.01)

(52) U.S. Cl.
    CPC ...... *H01L 21/3065* (2013.01); *H01L 21/3085* (2013.01); *H01L 21/31144* (2013.01); *H01L 27/127* (2013.01); *H01L 29/66969* (2013.01)

(56) References Cited

U.S. PATENT DOCUMENTS

| | | | |
|---|---|---|---|
| 2012/0138942 A1* | 6/2012 | Segawa | H01L 27/1233 257/59 |
| 2012/0241750 A1* | 9/2012 | Chikama | H01L 27/1248 257/71 |

* cited by examiner

MANUFACTURING METHOD OF THIN FILM TRANSISTOR SUBSTRATE

FIELD OF THE INVENTION

The present invention relates to a skill field of a flat panel display, and more particularly to a manufacture method of a thin film transistor substrate.

BACKGROUND OF THE INVENTION

A flat panel display possesses advantages of being ultra thin, power saved and radiation free. It has been widely utilized. A present flat panel display mainly comprises a LCD (Liquid Crystal Display) or an OLED (Organic Light Emitting Display).

An OLED possesses many outstanding properties of self-illumination, no requirement of backlight, high contrast, ultra-thin, wide view angle, fast response, applicability of flexible panel, wide range of working temperature, simpler structure and process. The OLED is considered as next generation flat panel display technology. OLED can be categorized as PM-OLED (Passive matrix OLED) and AM-OLED (Active matrix OLED).

Generally, TFTs (thin film transistor) are utilized in the pixel driving circuit of an AM-OLED. The TFT substrate of AM-OLED requires two kinds of TFTs for driving: switching transistor and driving transistor which need bridge of a GI via (gate isolation via). The GI via requires an extra photolithographic process which comprises manufacture processes of thin film, photo, etching, stripping and etc.

The oxide semiconductor has higher electron mobility (the mobility of the oxide semiconductor is >10 cm$^2$/Vs and the mobility of the amorphous silicon (a-Si) is merely 0.5~0.8 cm$^2$/Vs) and has simpler manufacture process and higher compatibility with the amorphous silicon process in comparison with the Low Temperature Poly-silicon (LTPS). Therefore, it can be applicable to the skill fields of Liquid Crystal Display, Organic Light Emitting Display, Flexible Display and etc. Because it fits the new generation production lines and the possible applications in displays with Large, Middle and Small sizes. The oxide semiconductor is hot to the research field of the present industry because the great opportunity of application development.

For now, a common oxide semiconducting thin film transistor can be: an oxide semiconducting thin film transistor with Etch Stopper (ES) structure or an oxide semiconducting thin film transistor with Back channel etching (BCE) structure.

At present, the structure with more developments is the ESL (etching stopper layer) structure. In general, the manufacture of ESL requires an extra photolithographic process (including manufacture processes of thin film, photo, etching, stripping and etc) which can cause increase of the manufacture cost and the descending of the yield.

Please refer to FIG. 1 which is a structural diagram of an oxide semiconductor thin film transistor with etching resistance structure according to prior art. An Etch Stopper Layer (ESL) 300 is formed after the formation of the oxide semiconducting layer 100 and before the formation of the metal source/drain electrodes 200 for protecting the oxide semiconducting layer 100 and preventing the damages in the following processes (such as the formation of the metal source/drain electrodes 200). Accordingly, the stability of the oxide semiconducting thin film transistor is promoted. However, an additional photolithographic process is required for forming an etching stopper layer. One photolithographic process comprises manufacture processes of thin film, photo, etching, stripping and etc. The manufacture cost will be enormously increased and then the production yield is descending only because of extra forming one etching stopper layer.

SUMMARY OF THE INVENTION

An objective of the present invention is to provide a manufacture method of a thin film transistor substrate. In the same photolithographic process, the via deposing process is implemented to the gate isolation layer and the etching stopper layer is patterned. Comparing with the manufacture method of prior art, one photolithographic process can be eliminated. Meanwhile, the aperture ratio is raised by forming an open at the transparent conducting layer.

For realizing the aforesaid objective, the present invention provides a manufacture method of a thin film transistor substrate, comprising steps of:

step 1, providing a substrate;

step 2, deposing a first metal layer on the substrate and patterning the first metal layer to form gates of a switching transistor and a driving transistor;

step 3, deposing a gate isolation layer on the gates and the substrate;

step 4, deposing an oxide semiconducting layer on the gate isolation layer and patterning the oxide semiconducting layer;

step 5, deposing an etching stopper layer on the gate isolation layer and the oxide semiconducting layer;

step 6, implementing a via deposing process to the gate isolation layer with one photolithographic process and patterning the etching stopper layer;

step 7, forming a source/a drain on the etching stopper layer;

step 8, sequentially forming a protective layer, a flat layer on the etching stopper layer and the source/the drain;

step 9, forming a transparent conducting layer on the flat layer and exposed portion of the source/the drain and patterning the transparent conducting layer;

step 10, sequentially forming a pixel defining layer and a photospacer on the flat layer and the transparent conducting layer.

The substrate is a transparent substrate.

The substrate is a glass substrate.

In the sixth step, the one photolithographic process can utilize a halftone/gray tone exposure, and a dry etching process or an ashing process is implemented, and the photoresistor layer is stripped after the exposure to form the etching stopper layer with a predetermined pattern, and the via deposing process is implemented to the gate isolation layer.

In the sixth step, a regular exposure can be implemented in the one photolithographic process, and a dry etching process is implemented, and the photoresistor layer is stripped after the exposure to form the etching stopper layer with a predetermined pattern, and the via deposing process is implemented to the gate isolation layer.

In the sixth step, the via deposing process is to expose the gate of the driving transistor by etching the gate isolation layer, the etching stopper layer at the location of the via.

The oxide semiconducting layer is an indium gallium zinc oxide semiconducting layer.

The transparent conducting layer is formed by indium tin oxide.

In the ninth step, an open is formed at the transparent conducting layer to raise an aperture ratio.

The present invention further provides a manufacture method of a thin film transistor substrate, comprising steps of:

step 1, providing a substrate;

step 2, deposing a first metal layer on the substrate and patterning the first metal layer to form gates of a switching transistor and a driving transistor;

step 3, deposing a gate isolation layer on the gates and the substrate;

step 4, deposing an oxide semiconducting layer on the gate isolation layer and patterning the oxide semiconducting layer;

step 5, deposing an etching stopper layer on the gate isolation layer and the oxide semiconducting layer;

step 6, implementing a via deposing process to the gate isolation layer with one photolithographic process and patterning the etching stopper layer;

step 7, forming a source/a drain on the etching stopper layer;

step 8, sequentially forming a protective layer, a flat layer on the etching stopper layer and the source/the drain;

step 9, forming a transparent conducting layer on the flat layer and exposed portion of the source/the drain and patterning the transparent conducting layer;

step 10, sequentially forming a pixel defining layer and a photospacer on the flat layer and the transparent conducting layer;

the substrate is a transparent substrate;

the substrate is a glass substrate;

in the sixth step, a regular exposure can be implemented in the one photolithographic process, and a dry etching process is implemented, and the photoresistor layer is stripped after the exposure to form the etching stopper layer with a predetermined pattern, and the via deposing process is implemented to the gate isolation layer;

in the sixth step, the via deposing process is to expose the gate of the driving transistor by etching the gate isolation layer, the etching stopper layer at the location of the via;

the oxide semiconducting layer is an indium gallium zinc oxide semiconducting layer;

the transparent conducting layer is formed by indium tin oxide;

in the ninth step, an open is formed at the transparent conducting layer to raise an aperture ratio.

The benefits of the present invention are: with a manufacture method of a thin film transistor substrate provided by the present invention, in the same photolithographic process, the via deposing process is implemented to the gate isolation layer and the etching stopper layer is patterned. That is, the photolithographic process is not implemented but the oxide semiconducting pattern is formed directly after the gate isolation layer is formed. After the etching stopper layer is formed, the gate isolation layer and the etching stopper layer are patterned in the same photolithographic process. Comparing with the manufacture method of prior art, one photolithographic process can be eliminated. Meanwhile, the aperture ratio is raised by forming an open at the transparent conducting layer.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution, as well as beneficial advantages, of the present invention will be apparent from the following detailed description of an embodiment of the present invention, with reference to the attached drawings.

In drawings.

DETAILED DESCRIPTION OF PREFERRED EMBODIMENTS

Embodiments of the present invention are described in detail with the technical matters, structural features, achieved objects, and effects with reference to the accompanying drawings as follows.

Figure 1:
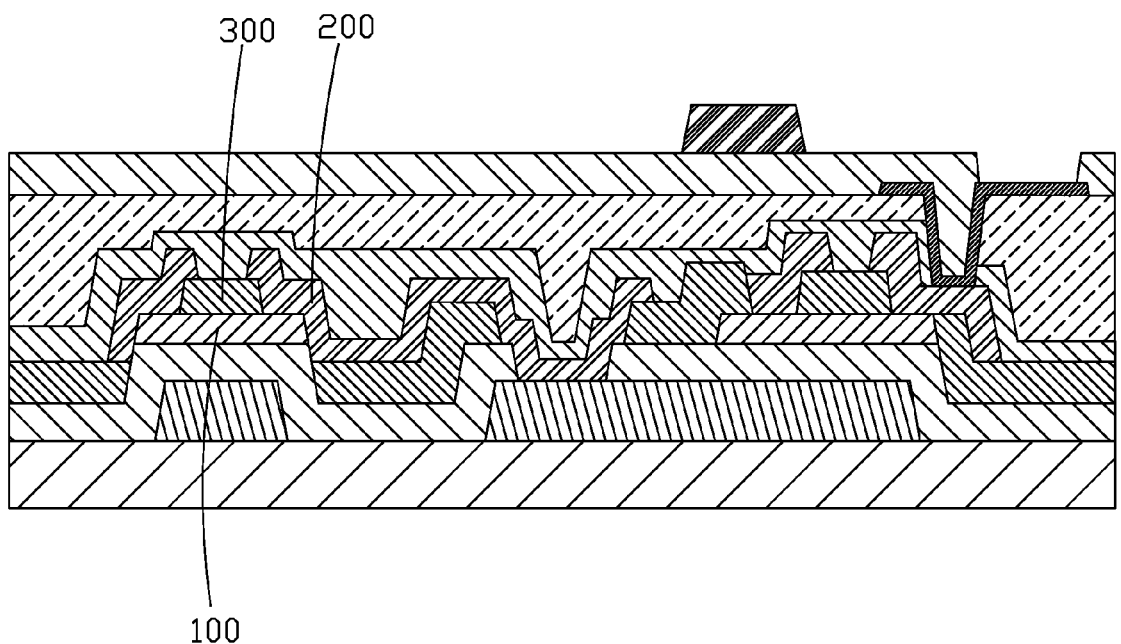
FIG. 1 is a structural diagram of an oxide semiconductor thin film transistor with etching resistance structure according to prior art.
Figure 2:
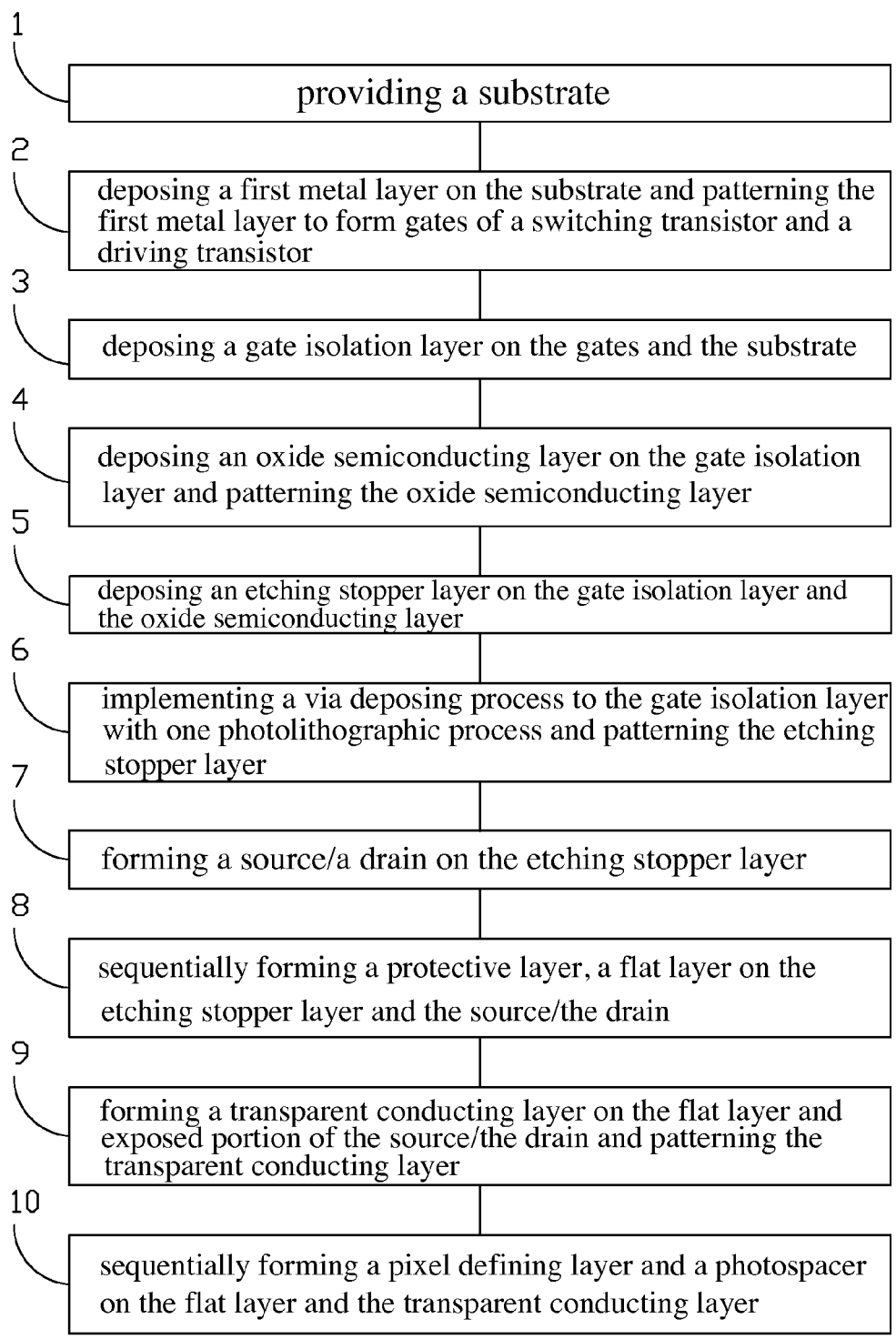
FIG. 2 is a flowchart of a manufacture method of a thin film transistor substrate according to the present invention.
Figure 3:
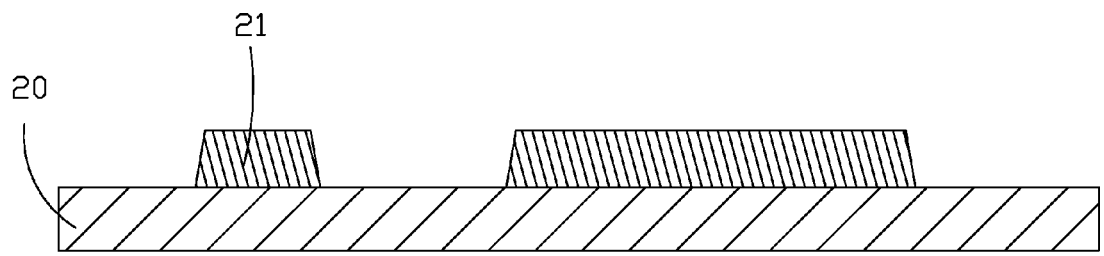
FIG. 3 to FIG. 10 are diagrams showing respective steps of the manufacture method of the thin film transistor substrate according to the present invention.
Figure 4:
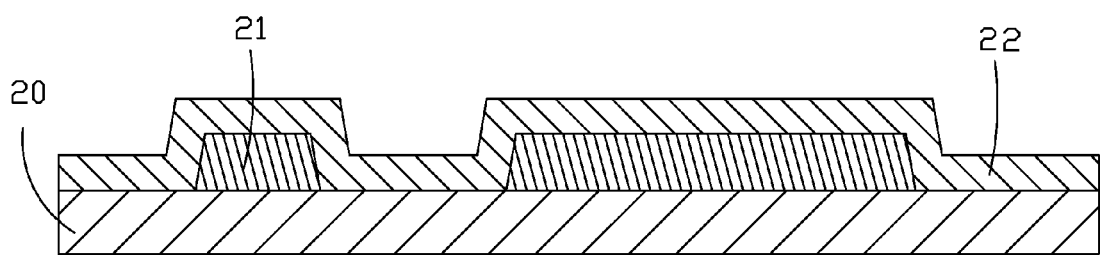
Figure 5:
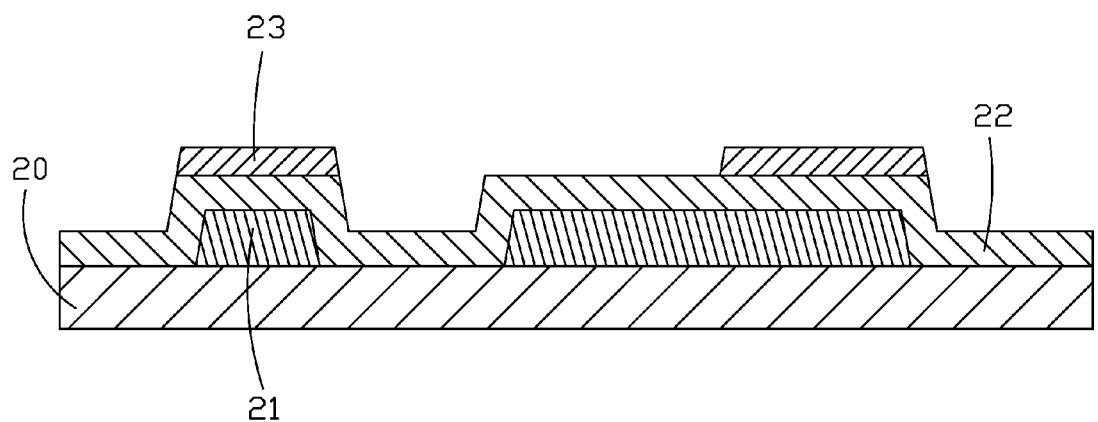
Figure 6:
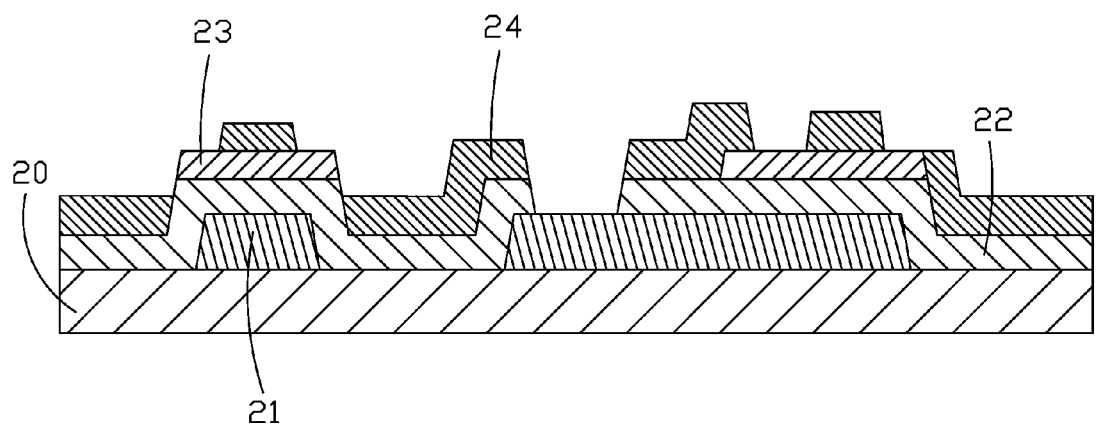
Figure 7:
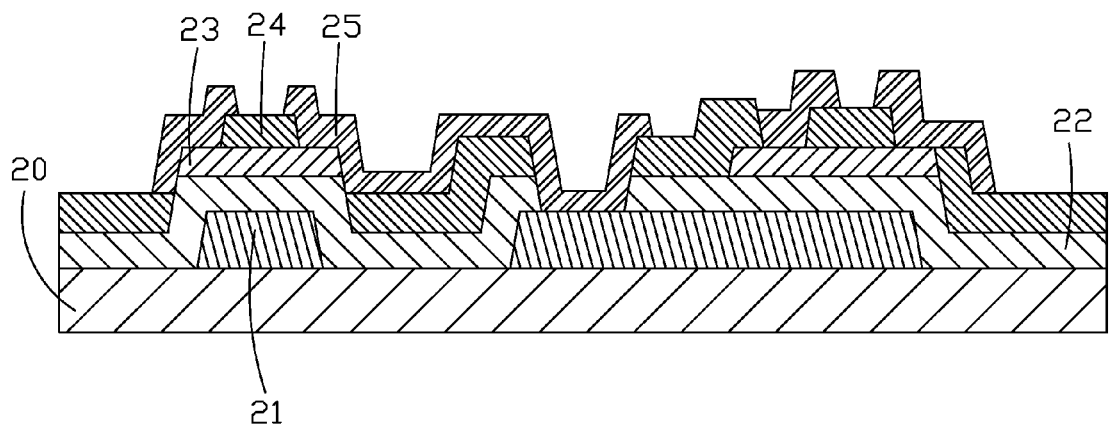
Figure 8:
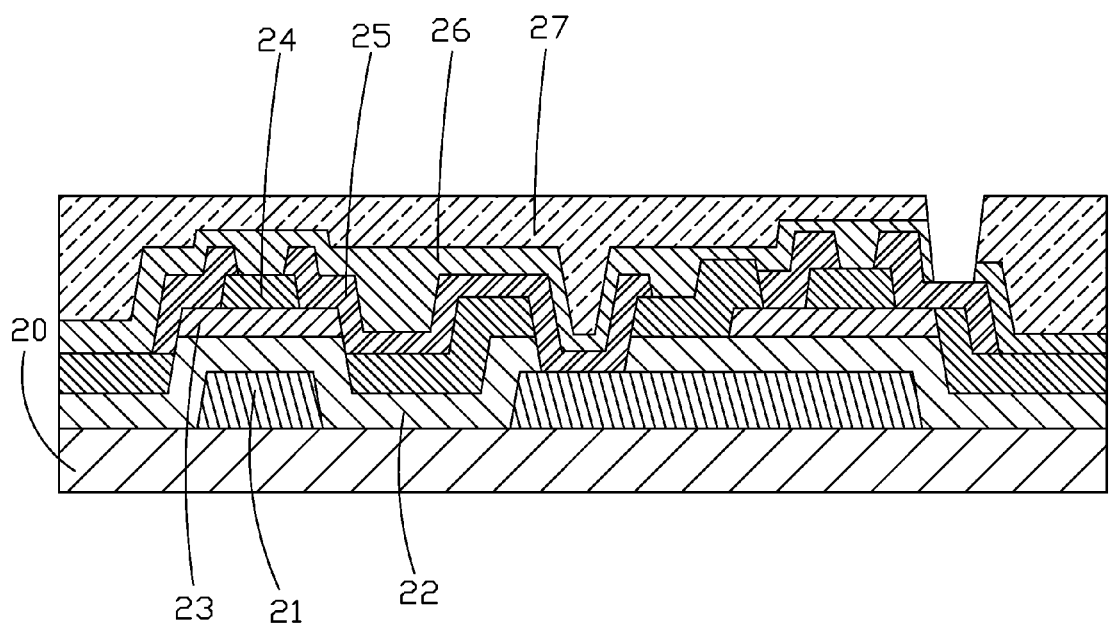
Figure 9:
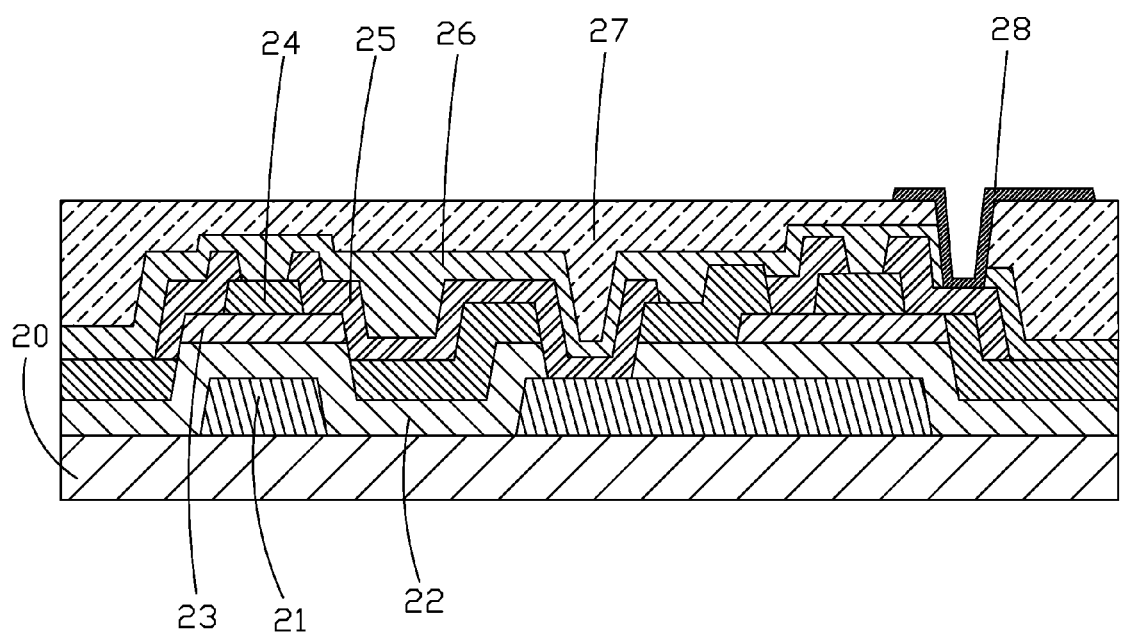
Figure 10:
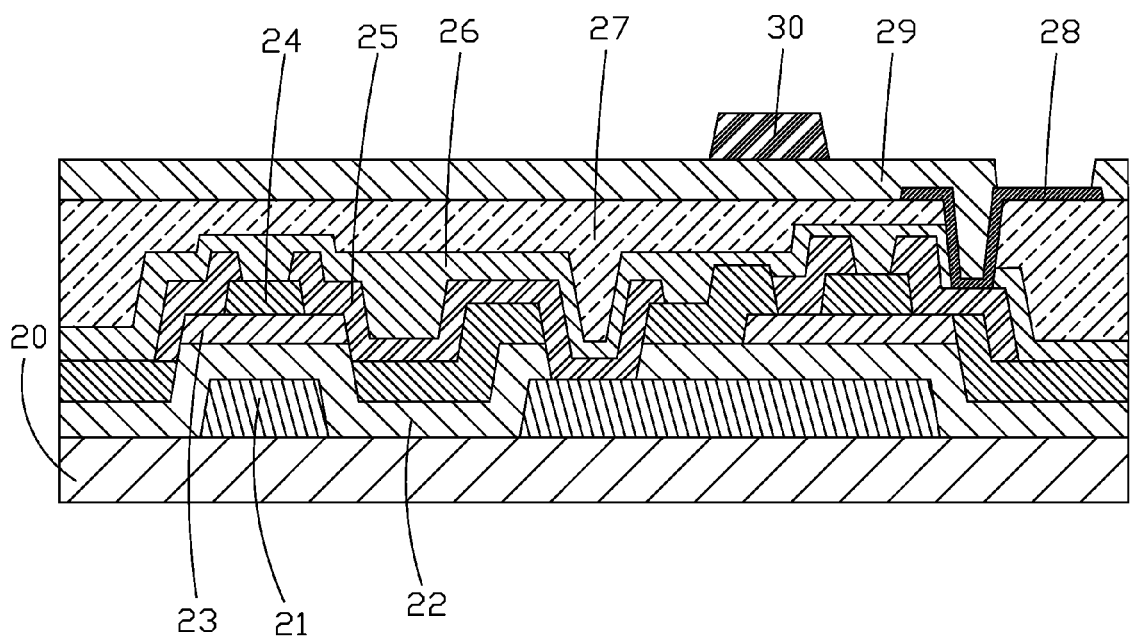

Please refer to FIG. 2 and from FIG. 3 to FIG. 10. The present invention provides a manufacture method of a thin film transistor substrate, comprising steps of:

step 1, providing a substrate 20.

The substrate 20 is a transparent substrate and preferably can be a glass substrate or a plastic substrate. In this embodiment, the substrate 20 is a glass substrate.

step 2, deposing a first metal layer on the substrate 20 and patterning the first metal layer to form gates 21 of a switching transistor (switching TFT) and a driving transistor (driving TFT).

Specifically, the first metal layer is formed on the substrate 20 by deposition, and then the exposure, development and etching processes are implemented with a mask or a halftone mask to form a gate 21 with a predetermined pattern.

step 3, deposing a gate isolation layer 22 on the gate 21 and the substrate 20.

The gate isolation layer 22 generally comprises one of the silicon oxide, silicon nitride and the combination thereof.

step 4, deposing an oxide semiconducting layer 23 on the gate isolation layer 22 and patterning the oxide semiconducting layer 23.

The oxide semiconducting layer 23 is IGZO (indium gallium zinc oxide) semiconducting layer.

The formation of the oxide semiconducting layer 23 is similar with the aforesaid formation of the gate 21. The detail description is omitted here.

step 5, deposing an etching stopper layer 24 on the gate isolation layer 22 and the oxide semiconducting layer 23.

step 6, implementing a via deposing process to the gate isolation layer 22 with one photolithographic process and patterning the etching stopper layer 24.

Specifically, the one photolithographic process can utilize a halftone/gray tone exposure, and a dry etching process or an ashing process is implemented, and the photoresistor layer is stripped after the exposure to form the etching stopper layer 24 with a predetermined pattern, and the via deposing process is implemented to the gate isolation layer 22.

Alternatively, a regular exposure can be implemented in the one photolithographic process, and a dry etching process is implemented, and the photoresistor layer is stripped after the exposure to form the etching stopper layer 24 with a predetermined pattern, and the via deposing process is implemented to the gate isolation layer 22.

The via deposing process is to expose the gate 21 of the driving transistor by etching the gate isolation layer 22, the etching stopper layer 24 at the location of the via.

step 7, forming a source/a drain 25 on the etching stopper layer 24.

The formation of the source/the drain 25 is similar with the aforesaid formation of the gate 21. The detail description is omitted here.

step 8, sequentially forming a protective layer 26, a flat layer 27 on the etching stopper layer 24 and the source/the drain 25.

The formation of the protective layer 26, the flat layer 27 is similar with the aforesaid formation of the gate 21. The detail description is omitted here.

step 9, forming a transparent conducting layer 28 on the flat layer 27 and exposed portion of the source/the drain 25 and patterning the transparent conducting layer 28.

The transparent conducting layer 28 is formed by indium tin oxide and the formation of the transparent conducting layer 28 is similar with the aforesaid formation of the gate 21. The detail description is omitted here.

Specifically, an open is formed at the transparent conducting layer 28 to raise an aperture ratio.

step 10, sequentially forming a pixel defining layer 29 and a photospacer 30 on the flat layer 27 and the transparent conducting layer 28.

The formation of the pixel defining layer 29 and the photospacer 30 is similar with the aforesaid formation of the gate 21. The detail description is omitted here.

In conclusion, the present invention provides a manufacture method of a thin film transistor substrate. In the same photolithographic process, the via deposing process is implemented to the gate isolation layer and the etching stopper layer is patterned. That is, the photolithographic process is not implemented but the oxide semiconducting pattern is formed directly after the gate isolation layer is formed. After the etching stopper layer is formed, the gate isolation layer and the etching stopper layer are patterned in the same photolithographic process. Comparing with the manufacture method of prior art, one photolithographic process can be eliminated. Meanwhile, the aperture ratio is raised by forming an open at the transparent conducting layer.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacture method of a thin film transistor substrate, comprising steps of:
    step 1, providing a substrate;
    step 2, depositing a first metal layer on the substrate and patterning the first metal layer to form a gate of a switching transistor and a gate of a driving transistor;
    step 3, depositing a gate isolation layer on the gates of the switching transistor and the driving transistor and the substrate;
    step 4, depositing an oxide semiconducting layer on the gate isolation layer and patterning the oxide semiconducting layer to form an oxide semiconducting block associated with the switching transistor and an oxide semiconducting block associated with the driving transistor and spaced from the oxide semiconducting block associated with the switching transistor;
    step 5, depositing an etching stopper layer on the gate isolation layer and the oxide semiconducting layer;
    step 6, implementing one photolithographic process that involves application of a photoresist layer that is treated for subsequently conducting a via deposing process to the gate isolation layer and patterning the etching stopper layer, wherein a via is formed in the via disposing process to extend through the etching stopper layer and the gate insolation layer and reach and expose the gate of the driving transistor and portions of the oxide semiconducting block of the switching transistor and portions of the oxide semiconducting block of the driving transistor are exposed such that one of the exposed portions of the oxide semiconducting block of the switching transistor and the exposed gate of the driving transistor are in communication with each other with a void space formed therebetween;
    step 7, forming a source/a drain associated with the switching transistor and a source/a drain associated with the driving transistor on the etching stopper layer, wherein the source/the drain of the switching transistor is in connection with the gate of the driving transistor through the via and the void space so as to form electrical connection between the source/the drain of the switching transistor and the gate of the driving transistor;
    step 8, sequentially forming a protective layer and a flat layer on the etching stopper layer and the source/the drain;
    step 9, forming a transparent conducting layer on the flat layer and exposed portions of the sources/the drains and patterning the transparent conducting layer; and
    step 10, sequentially forming a pixel defining layer and a photospacer on the flat layer and the transparent conducting layer;
    wherein in step 6, the one photolithographic process is conducted solely to expose both the exposed gate of the driving transistor and the one of the exposed portions of the oxide semiconductor block of the switching transistor such that the source/the drain of the switching transistor that is formed in step 7, which is subsequent step 6, is allowed to simultaneously contact both the exposed gate of the driving transistor and the one of the exposed portions of the oxide semiconductor block of the switching transistor.

2. The manufacture method of the thin film transistor substrate according to claim 1, wherein the substrate is a transparent substrate.

3. The manufacture method of the thin film transistor substrate according to claim 2, wherein the substrate is a glass substrate.

4. The manufacture method of the thin film transistor substrate according to claim 1, wherein in step 6, the one photolithographic process comprises halftone/gray tone exposure, and after the exposure, a dry etching process or an ashing process is implemented and the photoresist layer is stripped to form the etching stopper layer of a predetermined pattern and to also conduct the via deposing process on the gate isolation layer.

5. The manufacture method of the thin film transistor substrate according to claim 1, wherein in step 6, the one photolithographic process involves exposure, and after the exposure, a dry etching process is implemented and the photoresist layer is stripped to form the etching stopper layer of a predetermined pattern and to also conduct the via deposing process on the gate isolation layer.

6. The manufacture method of the thin film transistor substrate according to claim 1, wherein in step 6, the via deposing process comprises etching away a portion of the gate isolation layer and a portion of the etching stopper layer that correspond in position to the via to expose the gate of the driving transistor.

7. The manufacture method of the thin film transistor substrate according to claim 1, wherein the oxide semiconducting layer is an indium gallium zinc oxide semiconducting layer.

8. The manufacture method of the thin film transistor substrate according to claim 1, wherein the transparent conducting layer is formed by indium tin oxide.

9. The manufacture method of the thin film transistor substrate according to claim 1, wherein in step 9, an open is formed at the transparent conducting layer to raise an aperture ratio.

10. A manufacture method of a thin film transistor substrate, comprising steps of:
  step 1, providing a substrate;
  step 2, deposing a first metal layer on the substrate and patterning the first metal layer to form a gate of a switching transistor and a gate of a driving transistor;
  step 3, deposing a gate isolation layer on the gates of the switching transistor and the driving transistor and the substrate;
  step 4, deposing an oxide semiconducting layer on the gate isolation layer and patterning the oxide semiconducting layer to form an oxide semiconducting block associated with the switching transistor and an oxide semiconducting block associated with the driving transistor and spaced from the oxide semiconducting block associated with the switching transistor;
  step 5, deposing an etching stopper layer on the gate isolation layer and the oxide semiconducting layer;
  step 6, implementing one photolithographic process that involves application of a photoresist layer that is treated for subsequently conducting a via deposing process to the gate isolation layer and patterning the etching stopper layer, wherein a via is formed in the via disposing process to extend through the etching stopper layer and the gate insolation isolation layer and reach and expose the gate of the driving transistor and portions of the oxide semiconducting block of the switching transistor and portions of the oxide semiconducting block of the driving transistor are exposed such that one of the exposed portions of the oxide semiconducting block of the switching transistor and the exposed gate of the driving transistor are in communication with each other with a void space formed therebetween;
  step 7, forming a source/a drain associated with the switching transistor and a source/a drain associated with the driving transistor on the etching stopper layer, wherein the source/the drain of the switching transistor is in connection with the gate of the driving transistor through the via and the void space and is also in connection with the exposed portions of the oxide semiconducting block of the switching transistor so as to form electrical connection between the source/the drain of the switching transistor and the gate of the driving transistor;
  step 8, sequentially forming a protective layer and a flat layer on the etching stopper layer and the source/the drain;
  step 9, forming a transparent conducting layer on the flat layer and exposed portions of the sources/the drains and patterning the transparent conducting layer; and
  step 10, sequentially forming a pixel defining layer and a photospacer on the flat layer and the transparent conducting layer;
  wherein in step 6, the one photolithographic process is conducted solely to expose both the exposed gate of the driving transistor and the one of the exposed portions of the oxide semiconductor block of the switching transistor such that the source/the drain of the switching transistor that is formed in step 7, which is subsequent step 6, is allowed to simultaneously contact both the exposed gate of the driving transistor and the one of the exposed portions of the oxide semiconductor block of the switching transistor;
  wherein the substrate is a transparent substrate;
  wherein the substrate is a glass substrate;
  wherein in step 6, the one photolithographic process involves exposure, and after the exposure, a dry etching process is implemented and the photoresist layer is stripped to form the etching stopper layer of a predetermined pattern and to also conduct the via deposing process on the gate isolation layer;
  wherein in step 6, the via deposing process comprises etching away a portion of the gate isolation layer and a portion of the etching stopper layer that correspond in position to the via to expose the gate of the driving transistor;
  wherein oxide semiconducting layer is an indium gallium zinc oxide semiconducting layer;
  wherein the transparent conducting layer is formed by indium tin oxide; and
  wherein in step 9, an open is formed at the transparent conducting layer to raise an aperture ratio.

* * * * *